United States Patent
Motokawa et al.

(10) Patent No.: US 10,111,313 B2
(45) Date of Patent: Oct. 23, 2018

(54) PLASMA PROCESSING APPARATUS AND PLASMA PROCESSING METHOD

(71) Applicant: SHIBAURA MECHATRONICS CORPORATION, Yokohama-shi (JP)

(72) Inventors: Takeharu Motokawa, Kanagawa-ken (JP); Tokuhisa Ooiwa, Kanagawa-ken (JP); Kensuke Demura, Kanagawa-ken (JP); Tomoaki Yoshimori, Kanagawa-ken (JP); Makoto Karyu, Kanagawa-ken (JP); Yoshihisa Kase, Kanagawa-ken (JP); Hidehito Azumano, Kanagawa-ken (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 0 days.

(21) Appl. No.: 13/847,130

(22) Filed: Mar. 19, 2013

(65) Prior Publication Data
US 2013/0256270 A1 Oct. 3, 2013

(30) Foreign Application Priority Data
Mar. 27, 2012 (JP) .................................. 2012-071931

(51) Int. Cl.
*H01L 21/00* (2006.01)
*C23C 16/00* (2006.01)
(Continued)

(52) U.S. Cl.
CPC .......... *H05H 1/46* (2013.01); *H01J 37/32623* (2013.01); *H01J 37/32715* (2013.01); *H01J 37/32724* (2013.01)

(58) Field of Classification Search
CPC ....................... H01J 37/32715; H01J 37/32724
(Continued)

(56) References Cited

U.S. PATENT DOCUMENTS 4,931,135 A * 6/1990 Horiuchi et al. ................ 216/67
5,651,867 A * 7/1997 Kokaku et al. ........... 204/298.25
(Continued)

FOREIGN PATENT DOCUMENTS

JP 62189725 A * 8/1987
JP 06140187 A * 5/1994
(Continued)

OTHER PUBLICATIONS

Nakamura, Semiconductor Wafer Holding Device, Apr. 30, 2009, Sumitomo Metal Ind. Ltd., paragraphs[0012]-[0013].*
(Continued)

*Primary Examiner* — Sylvia MacArthur
*Assistant Examiner* — Michelle Crowell
(74) *Attorney, Agent, or Firm* — Oblon, McClelland, Maier & Neustadt, L.L.P.

(57) ABSTRACT

According to one embodiment, a plasma processing apparatus includes: a processing chamber; a decompression section configured to decompress inside of the processing chamber; a member including a control section to be inserted into a depression provided on mounting side of a workpiece, the control section being configured to thereby control at least one of in-plane distribution of capacitance of a region including the workpiece and in-plane distribution of temperature of the workpiece; a mounting section provided inside the processing chamber; a plasma generating section configured to supply electromagnetic energy to a region for generating a plasma for performing plasma processing on the workpiece; and a gas supply section configured to supply a process gas to the region for generating a plasma. The control section performs control so that at least one of the in-plane distribution of capacitance and the in-plane distribution of temperature is made uniform.

9 Claims, 9 Drawing Sheets

(51) Int. Cl.
*H05H 1/46* (2006.01)
*H01J 37/32* (2006.01)

(58) Field of Classification Search
USPC ............ 118/728, 723 E; 156/345.51, 345.43, 156/345.44, 345.45, 345.46, 345.47
See application file for complete search history.

(56) References Cited

U.S. PATENT DOCUMENTS

| | | | |
|---|---|---|---|
| 5,695,566 A * | 12/1997 | Suzuki et al. ............ | 118/723 E |
| 6,228,438 B1 * | 5/2001 | Schmitt ............... | C23C 16/4583 |
| | | | 118/723 E |
| 6,315,878 B1 * | 11/2001 | Patadia et al. ........... | 204/298.15 |
| 2004/0003898 A1 * | 1/2004 | Kim et al. ............... | 156/345.51 |
| 2006/0292727 A1 | 12/2006 | Motokawa et al. | |
| 2013/0087448 A1 * | 4/2013 | Takemoto ................ | 204/192.32 |

FOREIGN PATENT DOCUMENTS

| | | | | |
|---|---|---|---|---|
| JP | 08186094 A | * | 7/1996 | |
| JP | 2000174000 A | * | 6/2000 | |
| JP | 2002083800 A | * | 3/2002 | |
| JP | 4111625 | | 4/2008 | |
| JP | 2009-94147 | | 4/2009 | |

OTHER PUBLICATIONS

Office Action dated Dec. 3, 2015, in Japanese Patent Application No. 2012-071931, filed Mar. 27, 2012, with English-language Translation.

* cited by examiner

PLASMA PROCESSING APPARATUS AND PLASMA PROCESSING METHOD

CROSS-REFERENCE TO RELATED APPLICATIONS

This application is based upon and claims the benefit of priority from the prior Japanese Patent Application No. 2012-071931, filed on Mar. 27, 2012; the entire contents of which are incorporated herein by reference.

FIELD

Embodiments described herein relate generally to a plasma processing apparatus and plasma processing method.

BACKGROUND

Plasma processing using a plasma is utilized in widespread technical fields such as manufacturing of semiconductor devices, liquid crystal displays and other electronic devices, manufacturing of micromachines in the field of MEMS (microelectromechanical systems), and manufacturing of photomasks and precision optical components. Plasma processing is characterized by low cost and high speed. Furthermore, plasma processing is advantageous also in being able to reduce environmental pollution because it uses no chemicals.

A plasma processing apparatus for performing such plasma processing includes a mounting section for mounting a workpiece. In order to enhance adhesiveness between the upper surface of the mounting section and the workpiece, the upper surface shape of the mounting section is formed in conformity with the shape of the mounting side of the workpiece. For instance, in the case of a plate-like workpiece, the upper surface of the mounting section is formed as a flat surface. In the case where the mounting side of the workpiece is concave, the upper surface of the mounting section is formed in a convex shape (see, e.g., Patent Documents 1 and 2).

However, if the upper surface of the mounting section is simply formed in a convex shape, the in-plane distribution of the capacitance is made non-uniform. This may make it difficult to generate an uniform plasma. Furthermore, the in-plane distribution of the temperature of the workpiece may be made non-uniform.

Furthermore, if the upper surface shape of the mounting section is fixed, then when the shape of the mounting side of the workpiece is changed, the in-plane distribution of the capacitance may be made non-uniform. This may make it difficult to generate an uniform plasma. Furthermore, the in-plane distribution of the temperature of the workpiece may be made non-uniform.

DETAILED DESCRIPTION

Figure 1:
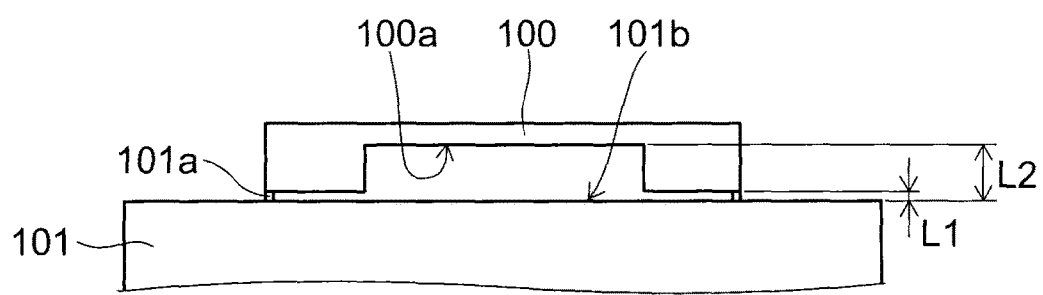
FIG. 1 is a schematic sectional view for illustrating an influence of a shape of a mounting side of a workpiece.

In general, according to one embodiment, a plasma processing apparatus includes: a processing chamber capable of maintaining an atmosphere decompressed to a pressure lower than atmospheric pressure; a decompression section configured to decompress inside of the processing chamber to a prescribed pressure; a member including a control section to be inserted into a depression provided on mounting side of a workpiece, the control section being configured to thereby control at least one of in-plane distribution of capacitance of a region including the workpiece and in-plane distribution of temperature of the workpiece; a mounting section provided inside the processing chamber and configured to mount or fix the member on an upper surface thereof; a plasma generating section configured to supply electromagnetic energy to a region for generating a plasma for performing plasma processing on the workpiece; and a gas supply section configured to supply a process gas to the region for generating a plasma. The control section performs control so that at least one of the in-plane distribution of capacitance and the in-plane distribution of temperature is made uniform.

In general, according to another embodiment, a plasma processing apparatus includes: a processing chamber capable of maintaining an atmosphere decompressed to a pressure lower than atmospheric pressure; a decompression section configured to decompress inside of the processing chamber to a prescribed pressure; a mounting section provided inside the processing chamber; a control section provided on an upper surface of the mounting section and configured to be inserted into a depression provided on mounting side of a workpiece and to thereby control at least one of in-plane distribution of capacitance of a region including the workpiece and in-plane distribution of temperature of the workpiece; a plasma generating section configured to supply electromagnetic energy to a region for generating a plasma for performing plasma processing on the workpiece; and a gas supply section configured to supply a process gas to the region for generating a plasma. The control section performs control so that at least one of the in-plane distribution of capacitance and the in-plane distribution of temperature is made uniform.

In general, according to another embodiment, a plasma processing method for generating a plasma in an atmosphere decompressed to a pressure lower than atmospheric pressure, exciting a process gas supplied toward the plasma to produce a plasma product, and using the plasma product to perform plasma processing on a workpiece is provided. The method includes: inserting a control section into a depression provided in the workpiece, the control section being configured to control at least one of in-plane distribution of capacitance of a region including the workpiece and in-plane distribution of temperature of the workpiece, in the inserting a control section, the control section being inserted into the depression provided in the workpiece so that at least one of the in-plane distribution of capacitance and the in-plane distribution of temperature is made uniform.

Embodiments will now be illustrated with reference to the drawings. In the drawings, similar components are labeled with like reference numerals, and the detailed description thereof is omitted appropriately.

First, the influence of the shape of the mounting side of the workpiece is illustrated.

FIG. 1 is a schematic sectional view for illustrating the influence of the shape of the mounting side of the workpiece.

As shown in FIG. 1, the mounting section 101 is provided with a protrusion 101a for supporting the peripheral region (the region not provided with the depression 100a) of the workpiece 100 so that the workpiece 100 is mounted on the upper surface of the protrusion 101a. When the workpiece 100 is mounted on the upper surface of the protrusion 101a, a gap having the height dimension L1 of the protrusion 101a is formed between the mounting side of the workpiece 100 and the upper surface 101b of the mounting section 101 at the portion supported by the protrusion 101a.

In the central portion of the mounting side of the workpiece 100, a depression 100a is provided. Thus, when the workpiece 100 is mounted on the upper surface of the protrusion 101a, a gap having dimension L2 elongated by the height dimension of the depression 100a is formed between the mounting side of the workpiece 100 and the upper surface 101b of the mounting section 101 at the portion where the depression 100a is located.

Here, the influence of the shape of the mounting side of the workpiece 100 exerting on the in-plane distribution of the capacitance of the workpiece 100 is illustrated.

Figure 2A:
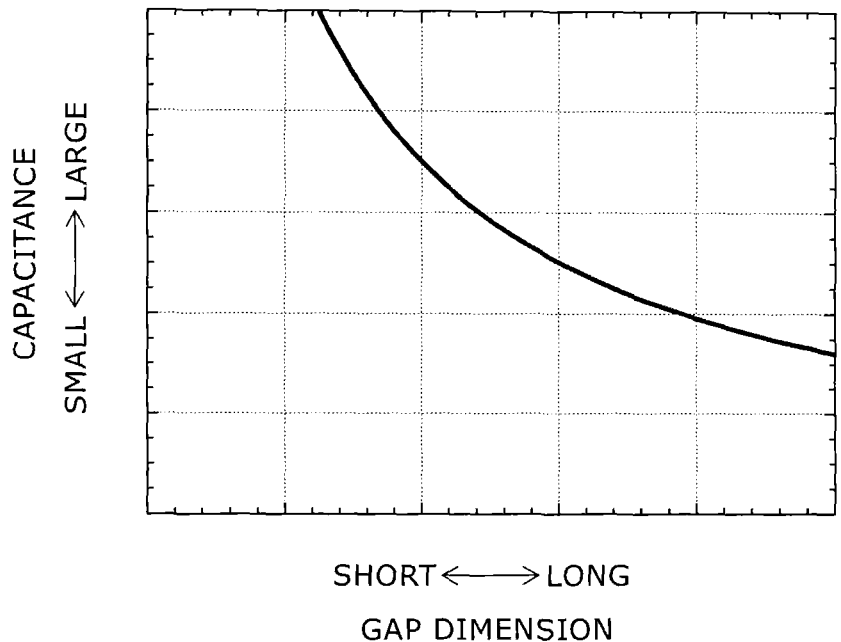
FIGS. 2A and 2B are graphs for illustrating the influence of the shape of the mounting side of the workpiece exerting on an in-plane distribution of the capacitance.
Figure 2B:
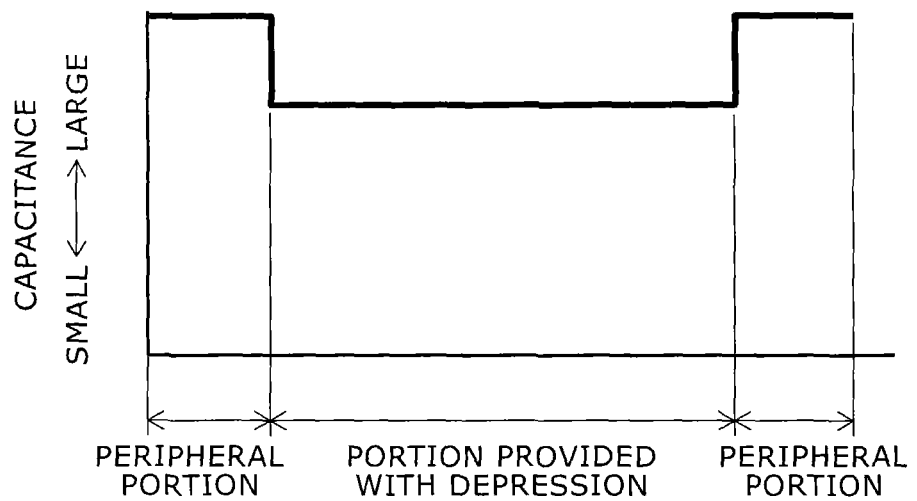

FIGS. 2A and 2B are graphs for illustrating the influence of the shape of the mounting side of the workpiece exerting on the in-plane distribution of the capacitance.

FIG. 2A is a graph for illustrating the relationship between the gap dimension and the capacitance under the reduced pressure environment. FIG. 2B is a schematic graph for illustrating the in-plane distribution of the capacitance in the workpiece 100 provided with the depression 100a.

As shown in FIG. 2A, when the dimension of the gap provided between the mounting side of the workpiece 100 and the upper surface 101b of the mounting section 101 is longer, the capacitance is smaller. Thus, as shown in FIG. 2B, in the peripheral region where the dimension to the upper surface 101b is shorter, the capacitance is larger. On the other hand, in the region provided with the depression 100a having a longer dimension to the upper surface 101b, the capacitance is smaller.

Thus, the capacitance is different between in the peripheral region of the workpiece 100 and in the region provided with the depression 100a of the workpiece 100. This means that the in-plane distribution of the capacitance of the workpiece 100 is non-uniform.

If the in-plane distribution of the capacitance of the workpiece 100 is non-uniform, it may be difficult to generate a uniform plasma. For instance, plasma processing using a capacitively coupled plasma is significantly affected by the in-plane distribution of the capacitance of the workpiece 100. This may make it difficult to generate a uniform plasma. As a result, for instance, a non-uniform in-plane distribution may occur in etching rate and compromise the uniformity of the processing.

The foregoing relates to the influence of the shape of the mounting side of the workpiece 100 exerting on the in-plane distribution of the capacitance of the workpiece 100.

Next, the influence of the shape of the mounting side of the workpiece 100 exerting on the in-plane distribution of the temperature of the workpiece 100 is illustrated.

In plasma processing, heating or cooling of the workpiece 100 may be performed. Such heating or cooling is performed by a heating apparatus or cooling apparatus, not shown, provided in the mounting section 101. However, because of the gap to the workpiece 100 and because the plasma processing is performed under the reduced pressure environment, heat conduction is primarily based on radiation. Thus, if the dimension between the mounting side of the workpiece 100 and the upper surface 101b of the mounting section 101 is longer, the radiation energy per unit area flowing into the workpiece 100 is decreased by that amount. This results in deteriorating the heat transfer.

Figure 3:
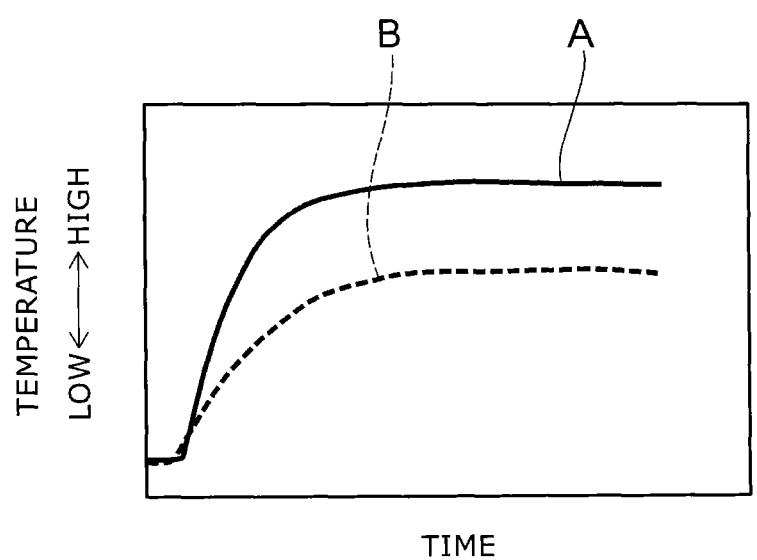
FIG. 3 is a graph for illustrating a temperature increase of a peripheral region of the workpiece 100 and the temperature increase of a region provided with a depression 100a of the workpiece 100.

FIG. 3 is a graph for illustrating the temperature increase of the peripheral region of the workpiece 100 and the temperature increase of the region provided with the depression 100a of the workpiece 100.

In FIG. 3, curve A represents the temperature increase of the peripheral region of the workpiece 100. Curve B represents the temperature increase of the region provided with the depression 100a of the workpiece 100.

As seen from curve A in FIG. 3, in the peripheral region where the dimension to the upper surface 101b is shorter, the time for temperature increase is shorter, and the achieved temperature is higher.

On the other hand, as seen from curve B in FIG. 3, in the portion where the dimension to the upper surface 101b is elongated by the depression 100a provided therein, the time for temperature increase is longer, and the achieved temperature is lower.

Thus, the temperature is different between in the peripheral region of the workpiece 100 and in the region provided with the depression 100a of the workpiece 100. This means that the in-plane distribution of the temperature of the workpiece 100 is non-uniform.

Next, a member 2 provided in the plasma processing apparatus according to this embodiment is illustrated.

Figure 4A:
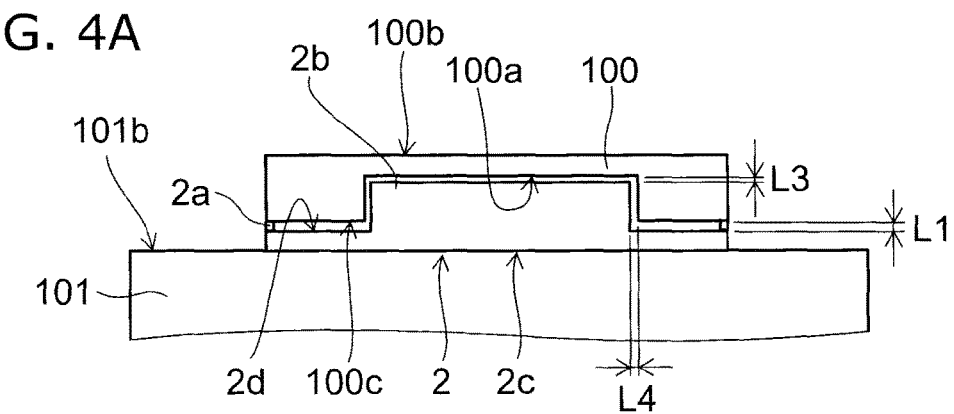
FIGS. 4A to 4C are schematic sectional views for illustrating a member 2 provided in a plasma processing apparatus according to the embodiment.
Figure 4B:
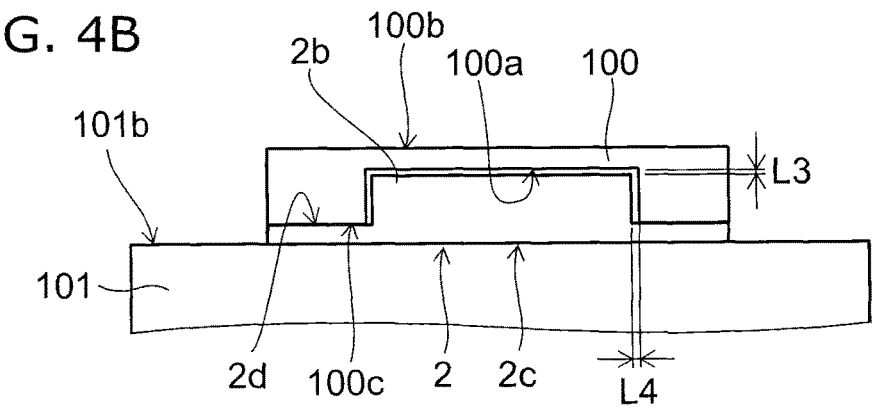
Figure 4C:
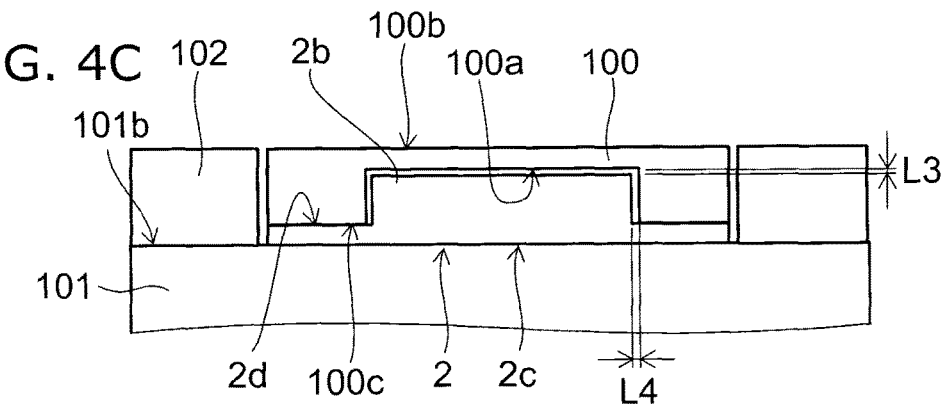

FIGS. 4A to 4C are schematic sectional views for illustrating the member 2 provided in the plasma processing apparatus according to this embodiment.

As shown in FIG. 4A, the member 2 is provided on the upper surface 101b of the mounting section 101. The member 2 may be removably fixed to the upper surface 101b of the mounting section 101, or may be mounted on the upper surface 101b of the mounting section 101.

The member 2 is provided with a protrusion 2a for supporting the peripheral region of the workpiece 100 so that the workpiece 100 is mounted on the upper surface of the protrusion 2a. When the workpiece 100 is mounted on the upper surface of the protrusion 2a, a gap having the height dimension L1 of the protrusion 2a is formed between the surface 100c of the mounting side of the workpiece 100 and the surface 2d of the member 2 at the portion supported by the protrusion 2a.

The protrusion 2a has the function of forming a gap (dimension L1) for controlling capacitance or heat conduction described later. Furthermore, the protrusion 2a can also have the function of supporting the workpiece 100 to avoid misalignment.

Here, the mounting section 101 may be connected with a radio frequency generating section, not shown, for generating electrical discharge, or may be provided with a heating apparatus or cooling apparatus, not shown, for heating or cooling the workpiece 100. The upper surface 101b of the mounting section and the surface 2c of the member 2 are flat surfaces and in uniform contact with each other.

Furthermore, the member 2 is provided with a control section 2b.

The control section 2b is provided in alignment with the region where the depression 100a is located when the workpiece 100 is mounted. Thus, the control section 2b can be inserted into the depression 100a when the workpiece 100 is mounted.

In order to generate a uniform plasma, preferably, the in-plane distribution of the capacitance of the workpiece 100 subjected to plasma processing is made uniform.

Thus, the control section 2b is inserted into the depression 100a so that the in-plane distribution of the apparent capacitance of the workpiece 100 is made uniform. That is, the control section 2b is inserted into the depression 100a to make uniform the in-plane distribution of the capacitance of the region including the workpiece 100 (in FIGS. 4A to 4C, the region inside the periphery of the workpiece 100 in plan view and between the upper surface 101b of the mounting section 101 and the surface 100b of the workpiece 100 on the opposite side from the mounting side).

In this case, the distribution of the resultant permittivity obtained by combining the permittivity of the workpiece 100, the permittivity of the space where the gap is formed (e.g., vacuum permittivity), and the permittivity of the member 2 is made uniform inside the periphery of the workpiece 100. Then, the in-plane distribution of the capacitance can be made uniform. The distribution of the resultant permittivity can be made uniform by appropriately setting the permittivity of the member 2 and the gap dimensions L1 (height dimension of the protrusion 2a), L3, and L4.

Furthermore, preferably, the condition for the capacitance of the workpiece 100 and the condition for the capacitance of the control section 2b are made comparable.

For instance, the member 2 is formed from the same material as the workpiece 100. The in-plane distribution of the total dimension of the thickness dimension of the workpiece 100 and the thickness dimension of the member 2 is made uniform. Furthermore, the gap dimension L3 and the gap dimension L1 are made equal.

Here, preferably, the dimension L4 between the peripheral surface of the control section 2b and the depression 100a of the workpiece 100 is made as small as possible. For instance, the depression 100a can be filled with the control section 2b.

On the other hand, the in-plane distribution of the temperature of the workpiece 100 subjected to plasma processing is made uniform. To this end, preferably, the condition for the heat conduction of the mounting section 101 and the condition for the heat conduction of the member 2 are made comparable.

For instance, the member 2 can be formed from a material having the same thermal conductivity as the mounting section 101. In this case, the member 2 can be formed from the same material as the mounting section 101.

Furthermore, preferably, the aforementioned dimension L3 is made equal to the dimension L1. Furthermore, preferably, the aforementioned dimension L4 is made equal to the dimension L1. That is, preferably, the gap dimension is made uniform. In this case, preferably, the gap dimension is made smaller. For instance, preferably, the gap dimension is set to 1 mm or less.

The member 2 can have at least one of the permittivity equal to the permittivity of the workpiece 100 and the thermal conductivity equal to the thermal conductivity of the mounting section 101.

Thus, the control section 2b provided in the member 2 is inserted into the depression 100a of the workpiece 100. This can control at least one of the in-plane distribution of the capacitance of the region including the workpiece 100 and the in-plane distribution of the temperature of the workpiece 100.

In this case, the member 2 provided with the control section 2b can perform control so that at least one of the in-plane distribution of the temperature and the in-plane distribution of the capacitance is made uniform.

As shown in FIG. 4B, without providing the protrusion 2a, the surface 2d formed as a flat surface and the surface 100c of the mounting side of the workpiece 100 can be brought into uniform contact with each other. In this case, depending on the material, thickness dimension and the like of the workpiece 100, the material and thickness dimension of the member 2, the gap dimension L3 and the like can be appropriately selected. This can control at least one of the in-plane distribution of the capacitance of the region including the workpiece 100 and the in-plane distribution of the temperature of the workpiece 100 described above.

As shown in FIG. 4C, a member 102 may be placed around the member 2 and the workpiece 100.

This can control at least one of the in-plane distribution of the capacitance and the in-plane distribution of the temperature of a region larger than the region including the workpiece 100 above the mounting section 101. In this case, at least one of the in-plane distribution of the capacitance and the in-plane distribution of the temperature of a region larger than the region including the workpiece 100 can be made uniform.

Figure 5A:
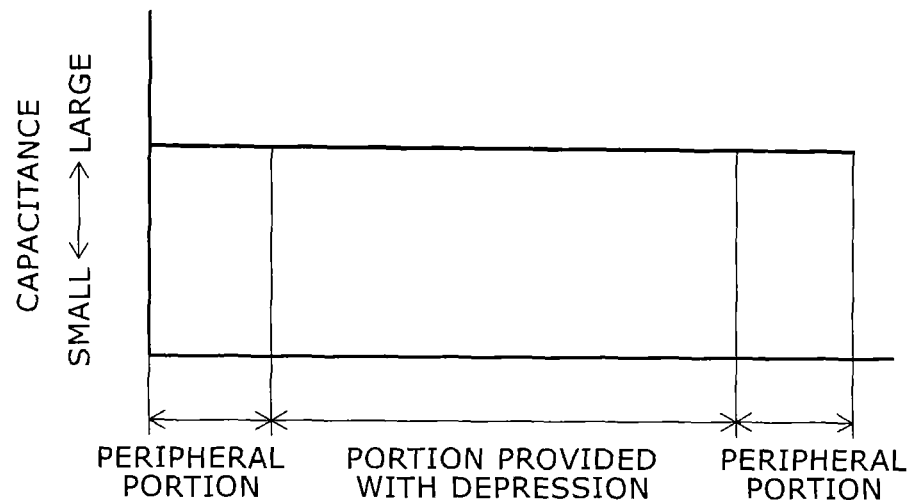
FIGS. 5A and 5B are graphs for illustrating an effect of the member 2 provided with a control section 2b.
Figure 5B:
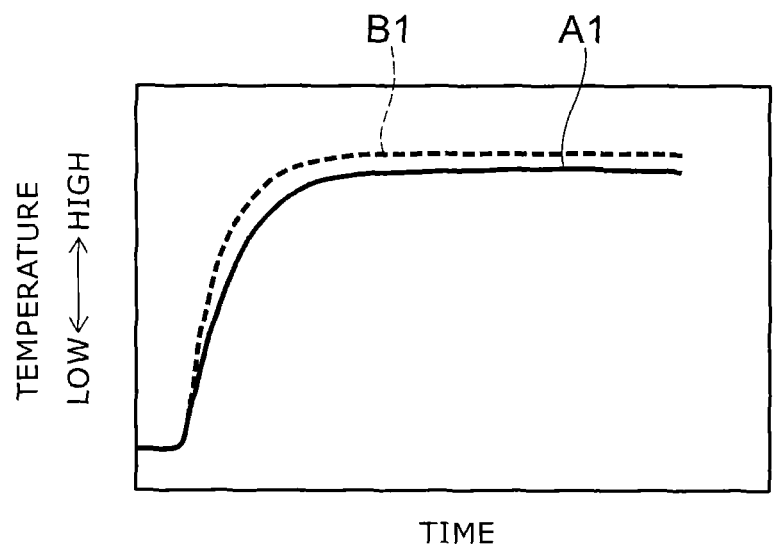

FIGS. 5A and 5B are graphs for illustrating the effect of the member 2 provided with the control section 2b.

FIG. 5A is a schematic graph for illustrating the in-plane distribution of the apparent capacitance in the workpiece 100 provided with the depression 100a (the in-plane distribution of the capacitance of the region including the workpiece).

FIG. 5B is a schematic graph for illustrating the temperature increase of the peripheral region of the workpiece 100 and the temperature increase of the region provided with the depression 100a of the workpiece 100. In FIG. 5B, curve A1 represents the temperature increase of the peripheral region of the workpiece 100. Curve B1 represents the temperature increase of the region provided with the depression 100a of the workpiece 100.

When the member 2 provided with the control section 2b is used, as shown in FIG. 5A, the in-plane distribution of the apparent capacitance of the workpiece 100 subjected to plasma processing can be made uniform. Thus, a uniform plasma can be generated. Accordingly, uniform processing can be performed.

Here, the condition for the capacitance of the workpiece 100 and the condition for the capacitance produced by the member 2 and the gap (the gap between the member 2 and the workpiece 100) are made comparable. Then, the in-plane distribution of the apparent capacitance is made more uniform. Thus, a uniform plasma is generated more easily. Accordingly, more uniform processing can be performed.

For instance, the member 2 is formed from a material having a permittivity comparable to that of the workpiece 100. Furthermore, the aforementioned dimension L1 and the dimension L3 are made equal. Alternatively, the resultant permittivity obtained by combining the permittivity of the workpiece 100, the permittivity of the aforementioned space where the gap is formed (e.g., vacuum permittivity), and the permittivity of the member 2 is made equal in the peripheral region of the workpiece 100 and the region provided with the depression 100a.

For instance, in the state in which the control section 2b is inserted into the depression 100a provided on the mounting side of the workpiece 100, the dimension between the workpiece 100 and the control section 2b can be set so that the capacitance is equal in the region provided with the depression 100a of the workpiece 100 and the region not provided with the depression 100a of the workpiece 100.

When the member 2 provided with the control section 2b is used, heat conduction based on radiation can be made comparable in the peripheral region of the workpiece 100 and the region provided with the depression 100a of the workpiece 100. Thus, as shown in FIG. 5B, the time for temperature increase and the achieved temperature can be made comparable. Here, the region provided with the depression 100a of the workpiece 100 is thinner in thickness than the peripheral region of the workpiece 100. Thus, the region provided with the depression 100a of the workpiece 100 is heated slightly more rapidly, and the temperature is made slightly higher. In this case, the material of the member 2 and the material of the workpiece 100 can be made equal, and the gap dimensions L1, L3, and L4 can be made equal. This can further decrease the difference in the time for temperature increase and the achieved temperature.

Considering that heat conduction is primarily based on radiation, preferably, the gap dimension is made as small as possible. For instance, the gap dimension is set to 1 mm or less. This can further decrease the difference in the time for temperature increase and the achieved temperature.

Figure 6A:
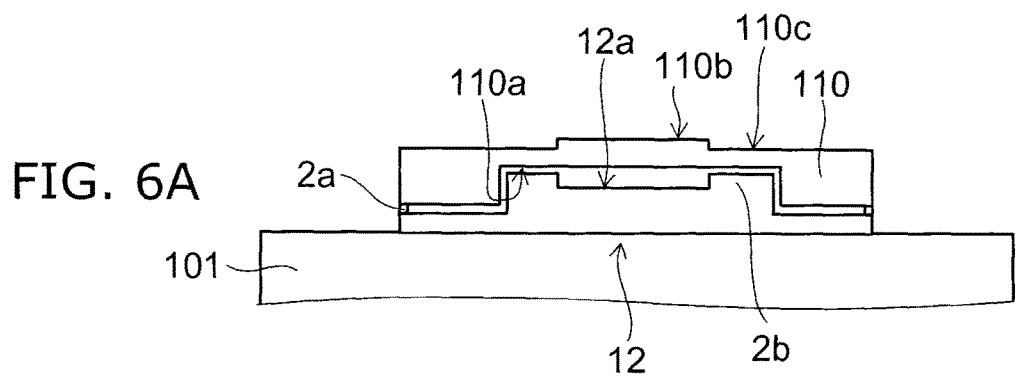
FIGS. 6A to 6C are schematic sectional views for illustrating members according to alternative embodiments.
Figure 6B:
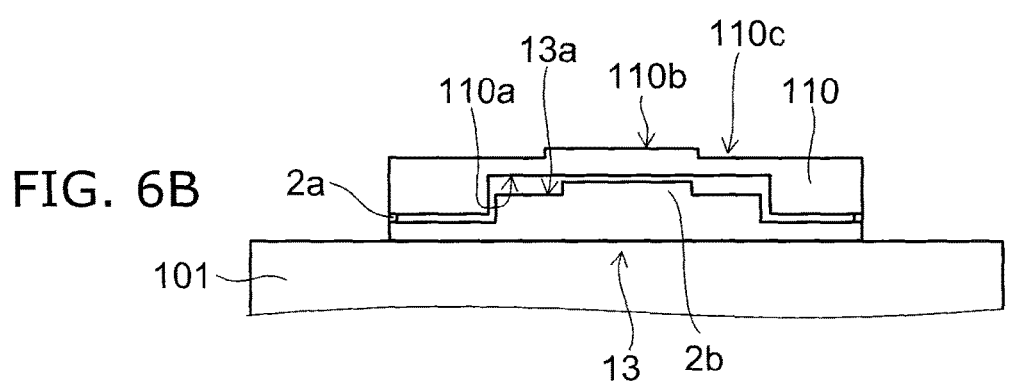
Figure 6C:
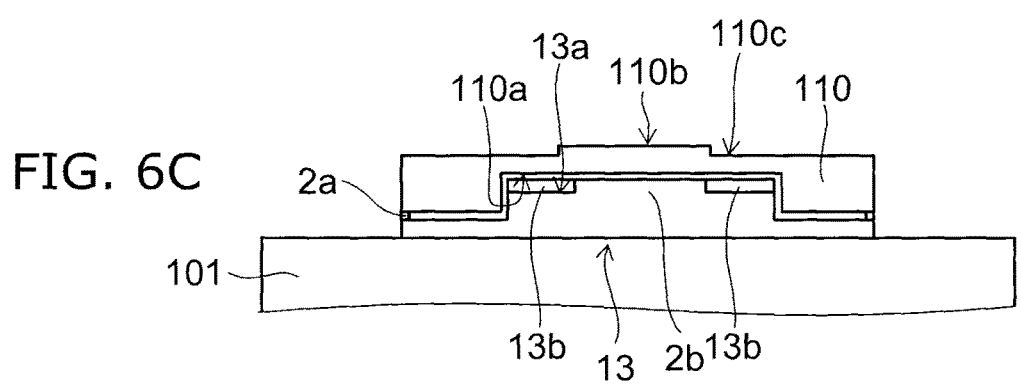

FIGS. 6A to 6C are schematic sectional views for illustrating members according to alternative embodiments.

In the workpiece 100 illustrated in FIGS. 4A to 4C, the depression 100a is provided on the mounting side. In contrast, in the workpiece 110 illustrated in FIGS. 6A to 6C, a depression 110a is provided on the mounting side, and a protrusion 110b is provided on the opposite side from the mounting side.

Even if the protrusion 110b is provided besides the depression 110a in this manner, the condition for the heat conduction of the workpiece 110 is not substantially changed. Thus, the influence on the achieved temperature is small. Accordingly, even if the protrusion 110b is provided, the influence on the uniformization of the in-plane distribution of the temperature is small. Thus, the aforementioned member 2 may be used. However, the member can be provided with a depression, projection, adjustment member and the like described below to make the in-plane distribution of the temperature more uniform, and to control the in-plane distribution of the temperature.

In this case, if the protrusion 110b is provided, the influence on the in-plane distribution of the capacitance may be non-negligible.

Thus, as shown in FIG. 6A, the control section 2b is configured so that a depression 12a is provided at a position corresponding to the protrusion 110b. Accordingly, the in-plane distribution of the apparent capacitance of the workpiece 110 subjected to plasma processing can be made uniform. That is, the depression 12a can be provided to decrease the capacitance partly increased by the protrusion 110b provided. In this case, the member 12 can be the member 2 provided with the depression 12a.

If the protrusion 110b is provided, the uniformity of the generated plasma may be affected. For instance, depending on the process condition and the like of plasma processing, the etching rate may be increased in the region 110c having a thinner thickness provided around the protrusion 110b. Conversely, the etching rate may be decreased in the region 110c.

In the case where there is a portion having a higher etching rate in the region 110c around the protrusion 110b, the capacitance of this portion is decreased. Thus, the in-plane distribution of the etching rate can be made uniform.

For instance, as shown in FIG. 6B, the member 13 is configured to include a control section 2b provided with a depression 13a at a position corresponding to the portion having a higher etching rate in the region 110c. Thus, the in-plane distribution of the etching rate can be made uniform.

In the case where there is a portion having a lower etching rate in the region 110c, the capacitance of this portion is increased. Thus, the in-plane distribution of the etching rate can be made uniform. In such a case, for instance, the member is configured to include a control section 2b provided with a protrusion, not shown, at a position corresponding to the portion having a lower etching rate in the region 110c.

Depending on the process condition and the like of plasma processing, the etching rate may be changed in the region 110c around the protrusion 110b. In such a case, the capacitance is changed at a position corresponding to the portion where the etching rate is changed in the region 110c. For instance, as shown in FIG. 6C, an adjustment member 13b capable of changing the capacitance is provided at a position corresponding to the portion where the etching rate is changed in the region 110c.

In this case, the capacitance can be changed by changing the permittivity of the adjustment member 13b.

For instance, in the case where there is a portion having a higher etching rate in the region 110c, the capacitance in this portion should be decreased. Thus, an adjustment member 13b made of a material having a low permittivity is provided. Conversely, in the case where there is a portion having a lower etching rate in the region 110c, the capacitance in this portion should be increased. Thus, an adjustment member 13b made of a material having a high permittivity is provided.

Thus, the adjustment member 13b for changing the capacitance is provided to respond to the change of etching rate. This can improve applicability to plasma processing.

In the foregoing example, the workpiece is provided with the protrusion 110b. The same also applies to the case where the workpiece is provided with a depression, or provided with a portion made of a different material.

That is, the member can be provided with the depression, projection, adjustment member and the like described above to make the in-plane distribution of the temperature uniform, to make the in-plane distribution of the capacitance uniform, to control the in-plane distribution of the temperature, and to control the in-plane distribution of the capacitance.

In this case, the member 2, 12, 13 can be provided with at least one of a region having a thermal conductivity different from the thermal conductivity of the mounting section 101 and a region having a permittivity different from the permittivity of the workpiece.

The member 2, 12, 13 provided with the control section 2b may be removably fixed to the upper surface 101b of the mounting section 101, or may be mounted on the upper surface 101b of the mounting section 101.

In the case where the member 2, 12, 13 provided with the control section 2b is mounted on the upper surface 101b of the mounting section 101, the workpiece 100 is mounted on the member 2, 12, 13 outside the plasma processing apparatus. They are transported into the plasma processing apparatus and mounted on the upper surface 101b of the mounting section 101. Then, before the workpiece 100 is mounted on the mounting section 101, the in-plane distribution of the capacitance and the in-plane distribution of the temperature can be optimally controlled in advance.

When the member 2, 12, 13 provided with the control section 2b is used, the change of the configuration of the workpiece 100 or the change of the process condition of plasma processing can be addressed by changing the configuration of the control section 2b or appropriately providing the member with the depression, projection, adjustment member and the like described above. Thus, the change can be responded rapidly and easily.

Here, there is no need to change the configuration of the upper surface 101b of the mounting section 101. This can enhance the versatility of the plasma processing apparatus. Furthermore, the embodiments can be easily adapted to existing plasma processing apparatuses.

The foregoing has illustrated the case of using the member 2 provided with the control section 2b.

Next, the case of providing a control section 2b on the upper surface 101b of the mounting section 101 is illustrated.

Figure 7:
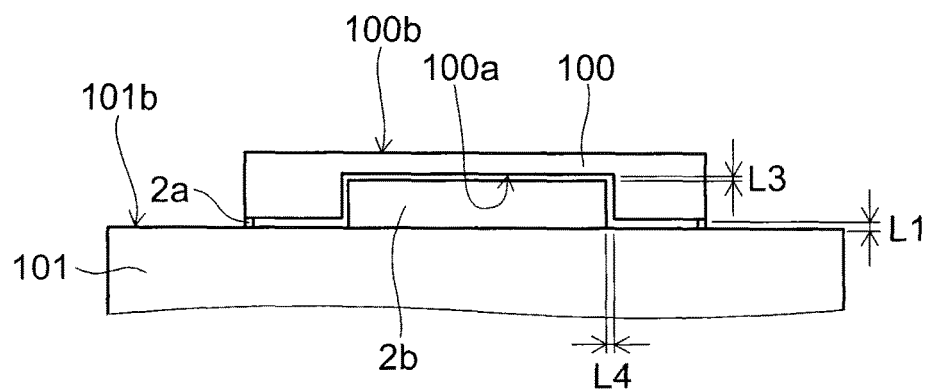
FIG. 7 is a schematic sectional view for illustrating a case of providing a control section 2b on an upper surface 101b of a mounting section 101.

FIG. 7 is a schematic sectional view for illustrating the case of providing a control section 2b on the upper surface 101b of the mounting section 101.

As shown in FIG. 7, in the case of a workpiece 100 provided with a depression 100a, a control section 2b is provided on the upper surface 101b of the mounting section 101.

The control section 2b is provided in alignment with the region where the depression 100a is located when the workpiece 100 is mounted. Thus, the control section 2b can be inserted into the depression 100a when the workpiece 100 is mounted. The control section 2b can be appropriately provided with the depression, projection, adjustment member and the like described above. The control section 2b may be removably fixed to the upper surface 101b of the mounting section 101, or may be formed integrally with the mounting section 101.

Then, it is possible to enjoy functions and effects similar to those in the case where the member 2, 12, 13 provided with the control section 2b is fixed to the upper surface 101b of the mounting section 101.

Making uniform the in-plane distribution of the apparent capacitance of the workpiece 100, and making uniform the in-plane distribution of the temperature of the workpiece 100, are made similar to those described above, and hence the detailed description thereof is omitted.

Here, by changing the dimension between the control section 2b and the workpiece 100, the condition for the in-plane distribution of the capacitance and the condition for the in-plane distribution of the temperature of the workpiece 100 can also be controlled.

For instance, by changing the dimension between the upper surface of the control section 2b and the workpiece 100, the in-plane distribution of the apparent capacitance of the workpiece 100 can be made uniform, and the in-plane distribution of the temperature of the workpiece 100 can be made uniform. Furthermore, the in-plane distribution of the capacitance and the in-plane distribution of the temperature of the workpiece 100 can be set to a prescribed distribution.

Figure 8A:
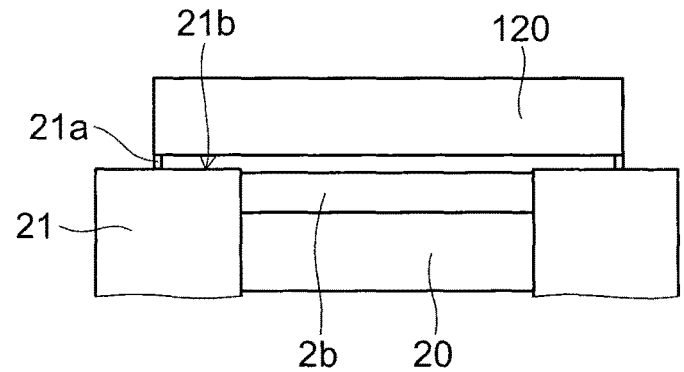
FIGS. 8A and 8B are schematic sectional views for illustrating a case of controlling a condition for an in-plane distribution of a capacitance and a condition for an in-plane distribution of a temperature by changing a dimension between the control section 2b and the workpiece.
Figure 8B:
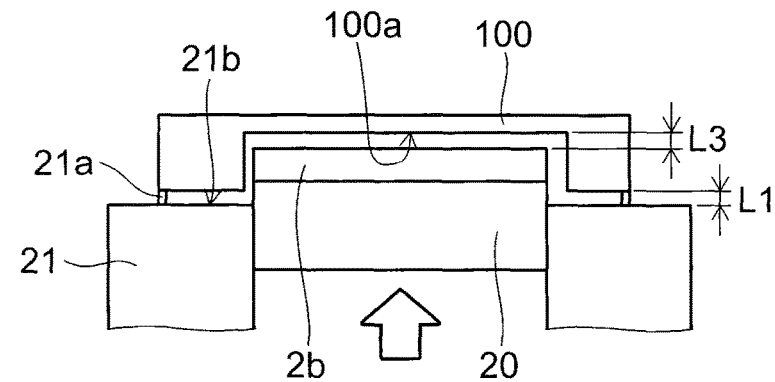

FIGS. 8A and 8B are schematic sectional views for illustrating the case of controlling the condition for the in-plane distribution of the capacitance and the condition for the in-plane distribution of the temperature by changing the dimension between the control section 2b and the workpiece.

FIG. 8A shows the case of a plate-like workpiece 120 not provided with the depression. FIG. 8B shows the case of a workpiece 100 provided with a depression 100a.

The examples shown in FIGS. 8A and 8B include a mounting section 21 provided with a protrusion 21a for supporting the peripheral region of the workpiece, a moving section 20 for axially moving the central portion of the mounting section 21, and a control section 2b provided on the end surface of the workpiece side of the moving section 20. That is, a moving section 20 for moving the control section 2b into the depression 100a of the workpiece 100 is provided. By moving the control section 2b by the moving section 20, the dimension between the workpiece 100 and the upper surface of the control section 2b can be changed in the region provided with the depression 100a. The control section 2b provided on the moving section 20 can also be appropriately provided with the depression, projection, adjustment member and the like described above.

In the case of a plate-like workpiece 120, the condition for the in-plane distribution of the capacitance and the condition for the in-plane distribution of the temperature do not necessarily need to be controlled by providing the control section 2b. Thus, as shown in FIG. 8A, the position of the control section 2b can be controlled by the moving section 20 so that the upper surface of the control section 2b does not protrude from the upper surface 21b of the mounting section 21.

In the case of a workpiece 100 provided with a depression 100a, as shown in FIG. 8B, the position of the control section 2b can be controlled by the moving section 20 so that the control section 2b is inserted into the depression 100a. In this case, by controlling the dimension L3 in FIG. 8B, the condition for the in-plane distribution of the capacitance and the condition for the in-plane distribution of the temperature can be controlled. For instance, as in the example illustrated in FIGS. 4A to 4C, the position of the control section 2b can be controlled by the moving section 20 so that the dimension L3 and the dimension L1 are made equal.

Figure 9:
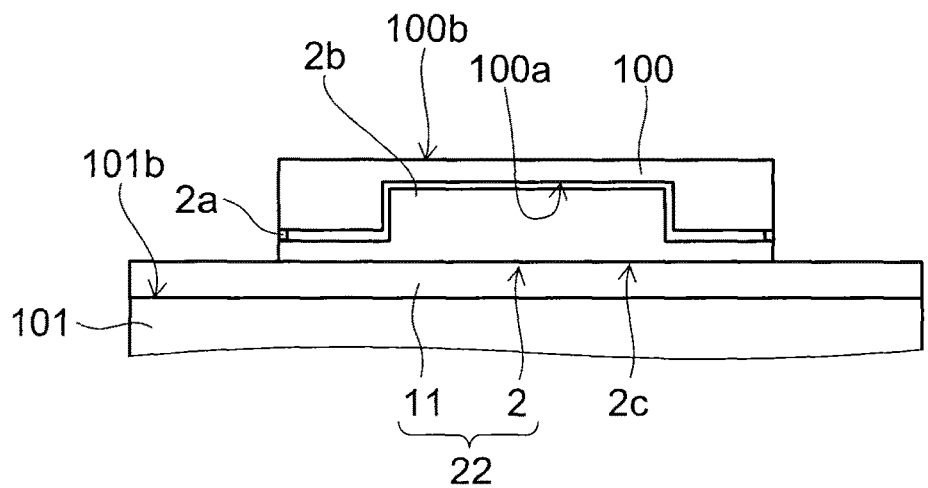
FIG. 9 is a schematic sectional view for illustrating a member according to an alternative embodiment.

FIG. 9 is a schematic sectional view for illustrating a member according to an alternative embodiment.

As shown in FIG. 9, the member 22 is provided with the aforementioned member 2 and an adjustment member 11. The adjustment member 11 is provided between the member 2 and the upper surface 101b of the mounting section 101. In this case, the adjustment member 11 may be fixed to the upper surface 101b of the mounting section 101, or may be fixed to the member 2.

The adjustment member 11 is provided to adjust the condition for the in-plane distribution of the capacitance and the condition for the in-plane distribution of the temperature.

For instance, like the aforementioned adjustment member 13b, the adjustment member 11 can be configured to change the capacitance by changing the permittivity, or can be configured to change the in-plane distribution of the temperature by changing the heat transfer.

Next, a plasma processing apparatus according to this embodiment is illustrated.

Figure 10:
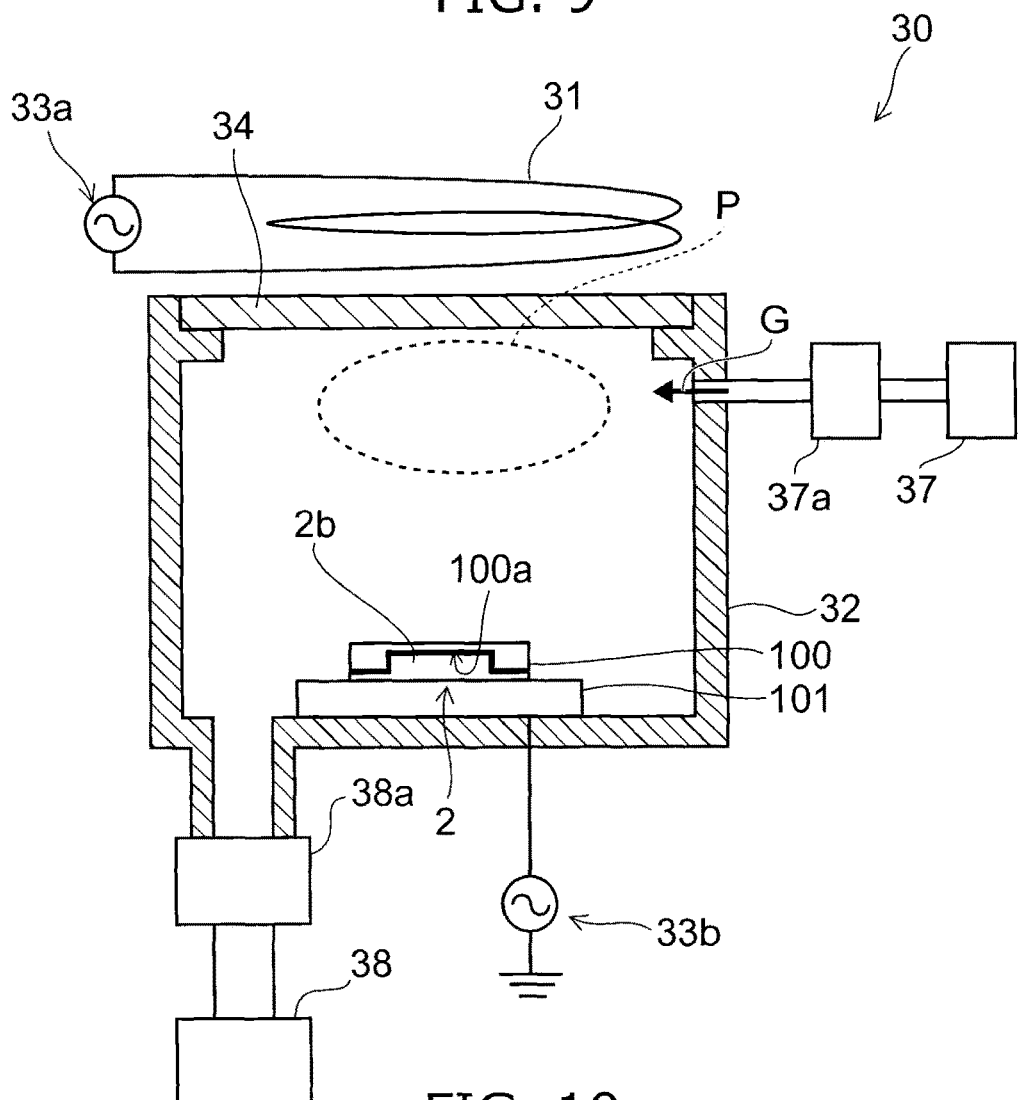
FIG. 10 is a schematic sectional view for illustrating the plasma processing apparatus according to the embodiment.

FIG. 10 is a schematic sectional view for illustrating the plasma processing apparatus according to this embodiment. The plasma processing apparatus 30 illustrated in FIG. 10 is a plasma processing apparatus for exciting a plasma by radio frequency electrical power. That is, the plasma processing apparatus 30 is an example of the plasma processing apparatus in which a plasma product is produced from a process gas using a plasma excited and generated by radio frequency energy to process a workpiece 100.

As shown in FIG. 10, the plasma processing apparatus 30 includes a mounting section 101, a plasma generating antenna 31, a processing chamber 32, radio frequency generating sections 33a, 33b, a gas supply section 37, a decompression section 38 and the like. Furthermore, the plasma processing apparatus 30 is provided with a control section, not shown, for controlling various components included in the plasma processing apparatus 30 such as the radio frequency generating sections 33a, 33b, the gas supply section 37, and the decompression section 38. Furthermore, the plasma processing apparatus 30 is provided with an operating section, not shown, for operating various components.

The plasma generating antenna 31 generates a plasma P by supplying radio frequency energy (electromagnetic energy) to a region for generating the plasma P.

The plasma generating antenna 31 is operative to supply radio frequency energy to the region for generating the plasma P through a transmissive window 34. The transmissive window 34 is shaped like a plate and made of a material having high transmittance to radio frequency energy and being resistant to etching. The transmissive window 34 is provided airtightly at the upper end of the processing chamber 32.

In this embodiment, the plasma generating antenna 31, the radio frequency generating sections 33a, 33b and the like constitute a plasma generating section for supplying electromagnetic energy to the region for generating a plasma for plasma processing of the workpiece 100.

To the sidewall upper portion of the processing chamber 32, the gas supply section 37 is connected through a flow rate control member (mass flow controller, MFC) 37a. A process gas G can be supplied from the gas supply section 37 through the flow rate control member 37a to the region for generating a plasma P in the processing chamber 32.

The processing chamber 32 has a bottomed, generally cylindrical shape and can maintain an atmosphere decompressed to a pressure lower than atmospheric pressure. The aforementioned mounting section 101 is provided inside the processing chamber 32.

On the upper surface 101b of the mounting section 101, a member 2 including a control section 2b is provided. As illustrated in FIG. 7, alternatively, the control section 2b can be provided on the upper surface 101b of the mounting section 101.

In this case, the member 2 may be mounted on the upper surface 101b of the mounting section 101, or may be removably fixed thereto. In the case where the member 2 is mounted on the upper surface 101b of the mounting section 101, the member 2 can be transported together with the workpiece 100 in the state in which the control section 2b is inserted into the depression 100a provided on the mounting side of the workpiece 100.

To the bottom surface of the processing chamber 32, the decompression section 38 such as a turbo molecular pump (TMP) is connected through a pressure control member (auto pressure controller, APC) 38a. The decompression section 38 decompresses the inside of the processing chamber 32 to a prescribed pressure. The pressure control member 38a controls the internal pressure of the processing chamber 32 to a prescribed pressure based on the output of a pressure gauge, not shown, for detecting the internal pressure of the processing chamber 32.

In performing plasma processing, the inside of the processing chamber 32 is decompressed to a prescribed pressure by the decompression section 38. A prescribed amount of process gas G (such as $CF_4$) is supplied from the gas supply section 37 to the region for generating a plasma P in the processing chamber 32. On the other hand, radio frequency electrical power having a prescribed power is inputted from the radio frequency generating section 33a to the plasma generating antenna 31. Thus, electromagnetic energy is emitted through the transmissive window 34 into the processing chamber 32. Furthermore, radio frequency electrical power having a prescribed power is inputted from the radio frequency generating section 33b to the mounting section 101 mounting the workpiece 100. This forms an electric field for accelerating ions directed from the plasma P toward the workpiece 100.

Thus, a plasma P is generated by the electromagnetic energy emitted into the processing chamber 32 and the electromagnetic energy inputted to the mounting section 101. In the generated plasma P, the process gas G is excited and activated to produce a plasma product such as neutral active species and ions. By the plasma product thus produced, the surface of the workpiece 100 is subjected to etching and the like.

According to this embodiment, the aforementioned control section 2b is provided. Thus, even in the case where the workpiece 100 including a depression 100a is subjected to plasma processing, the in-plane distribution of the capacitance or the in-plane distribution of the temperate of the workpiece 100 can be made uniform. This can improve the in-plane uniformity for plasma processing. Furthermore, the member 12, the member 13, the adjustment member 13b and the like illustrated in FIGS. 6A to 6C can be provided. The moving section 20 illustrated in FIGS. 8A and 8B can be provided. The adjustment member 11 and the like illustrated in FIG. 9 can be provided. In this case, the in-plane distribution of the capacitance or the in-plane distribution of the temperate of the workpiece 100 can be made uniform. Alternatively, the in-plane distribution of the capacitance or the in-plane distribution of the temperate of the workpiece can be set to a prescribed distribution. If the in-plane distribution of the capacitance or the in-plane distribution of the temperate of the workpiece 100 is set to a prescribed distribution, for instance, plasma processing in a specific region can be accelerated, and plasma processing in a specific region can be suppressed.

In the foregoing, the plasma processing apparatus 30 using radio frequency energy is illustrated. However, the embodiment is not limited thereto. The embodiment of the invention can be widely applied to various plasma processing apparatuses including remote plasma processing apparatuses such as a microwave excitation plasma processing apparatus.

Plasma processing is not limited to etching and ashing. For instance, the embodiment can be widely applied to various types of plasma processing such as surface activation, chemical free sterilization, thin film deposition, and surface modification.

Examples of the workpiece 100 provided with a depression 100a on the mounting side can include semiconductor wafers, photomasks, and components in the fields of MEMS (microelectromechanical systems) and optics, provided with a rib in the peripheral portion. However, the workpiece 100 is not limited thereto, but can be any workpiece subjected to plasma processing.

Next, a plasma processing method according to this embodiment is illustrated.

In the plasma processing method according to this embodiment, a workpiece 100 is mounted on the mounting section 101. A plasma P is generated in an atmosphere decompressed to a pressure lower than atmospheric pressure. A process gas G is supplied toward the plasma P and excited to produce a plasma product. This plasma product is used to perform plasma processing on the workpiece 100 mounted on the mounting section 101.

Furthermore, the method includes the step of inserting a control section 2b into a depression 100a provided in the workpiece 100. The control section 2b controls at least one of the in-plane distribution of the capacitance of the workpiece 100 and the in-plane distribution of the temperature of the workpiece 100.

In this case, when the workpiece 100 is mounted on the member 2, 12, 13, the aforementioned control section 2b may be inserted into the depression 100a. Alternatively, the control section 2b may be inserted into the depression 100a by the aforementioned moving section 20. The mounting of the workpiece 100 on the member 2, 12, 13 can be performed in the environment for performing plasma processing, or can be performed in the environment separated from the environment for performing plasma processing.

That is, in the step of inserting the control section 2b into the depression 100a, the workpiece 100 can be mounted on the member 2 including the control section 2b in the environment separated from the environment for performing plasma processing. Thus, the control section 2b can be inserted into the depression 100a provided in the workpiece 100.

In this case, the member 2 mounting the workpiece 100 is transported toward the environment for performing plasma processing. The transported member 2 mounting the workpiece 100 is mounted on a mounting section provided in the environment for performing plasma processing. Thus, the workpiece 100 mounted on the mounting section via the member 2 can be subjected to plasma processing.

Alternatively, in the step of inserting the control section 2b into the depression 100a, the workpiece 100 can be mounted on the mounting section 101 including the control section 2b in the environment for performing plasma processing. Thus, the control section 2b can be inserted into the depression 100a provided in the workpiece 100.

In the step of inserting the control section 2b into the depression 100a, by inserting the control section 2b into the depression 100a, at least one of the in-plane distribution of the capacitance and the in-plane distribution of the temperature can be made uniform.

In the step of inserting the control section 2b into the depression 100a, the member 2, 12, 13 having at least one of the thermal conductivity equal to the thermal conductivity of the mounting section 101 and the permittivity equal to the permittivity of the workpiece 100 can be used.

Alternatively, in the step of inserting the control section 2b into the depression 100a, the member 12, 13 having at least one of a permittivity different from the permittivity of the workpiece 100 and a region having a thermal conductivity different from the thermal conductivity of the mounting section 101 can be used.

For instance, the member 12, 13 provided with the depression 12a, the depression 13a, the adjustment member 13b and the like described above can be used.

In the step of inserting the control section 2b into the depression 100a, the dimension between the workpiece 100 and the upper surface of the control section 2b can be controlled.

For instance, the aforementioned moving section 20 is used to move the control section 2b into the depression 100a of the workpiece 100. Thus, the dimension between the workpiece 100 and the upper surface of the control section 2b can be controlled.

In the step of inserting the control section 2b into the depression 100a, the dimension between the workpiece 100 and the upper surface of the control section 2b can be made equal to the dimension (dimension L1) between the workpiece 100 and the portion not provided with the control section 2b of the member 2.

In the step of inserting the control section 2b into the depression 100a, the dimension between the workpiece 100 and the upper surface of the control section 2b can be made equal to the dimension between the workpiece 100 and the mounting section 101.

In the step of inserting the control section 2b into the depression 100a, the workpiece 100 can be mounted on the member 2, 12, 13, the adjustment member 11 or the like, which can be transported so that the workpiece 100 is transported into the environment for performing plasma processing.

The specifics for inserting the control section 2b into the depression 100a can be made similar to those described above, and hence the detailed description thereof is omitted.

The embodiments have been illustrated above. However, the invention is not limited to these descriptions.

For instance, in the example illustrated above, the depression 100a is provided in the central portion of the mounting side of the workpiece 100. However, the shape, size, and layout of the depression can be changed appropriately.

Figure 11:
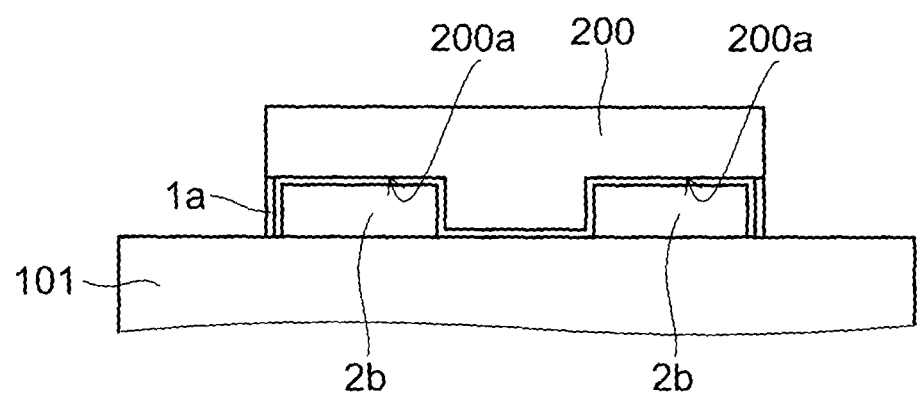
FIG. 11 is a schematic sectional view for illustrating a layout of the depression according to an alternative embodiment.

By way of example, FIG. 11 is a schematic sectional view for illustrating the layout of the depression according to an alternative embodiment.

As shown in FIG. 11, the depression 200a may be provided in the peripheral region of the mounting side of the workpiece 200. Also in such a case, the control section 2b can be provided to enjoy the aforementioned effects.

That is, also in such a case, the control section 2b is provided in alignment with the region where the depression 200a is located when the workpiece 200 is mounted. Thus, the control section 2b can be inserted into the depression 200a when the workpiece 200 is mounted.

Thus, the shape, size, layout and the like of the control section 2b can be appropriately changed depending on the shape, size, layout and the like of the depression provided on the mounting side of the workpiece.

The embodiments illustrated above can realize a plasma processing apparatus and a plasma processing method capable of suppressing the influence of the shape of the mounting side of the workpiece.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A plasma processing apparatus comprising:
a processing chamber capable of maintaining an atmosphere decompressed to a pressure lower than atmospheric pressure;
a decompression section configured to decompress inside of the processing chamber to a prescribed pressure;
a mounting section provided inside the processing chamber;
a plasma generating section configured to supply electromagnetic energy to a region for generating a plasma for performing plasma processing on the workpiece;
a gas supply section configured to supply a process gas to the region for generating a plasma; and
a member being mounted or fixed on an upper surface of the mounting section, the member including a control section, a first surface, and a protrusion provided on the first surface, the control section including a convex portion which has a second surface parallel to the first surface and a side surface connected to the second surface, the convex portion being provided in a depression provided on a mounting side of the workpiece, a gap being provided between the second surface and a bottom surface of the depression, the first surface provided around the convex portion, and the protrusion supporting a surface of a mounting side of the workpiece not provided with the depression.

2. The apparatus according to claim 1, wherein a direction of the second surface is perpendicular to a direction of the side surface.

3. The apparatus according to claim 1, wherein the member has a second surface outside the convex portion.

4. The apparatus according to claim 3, wherein the member is configured to control at least an in-plane distribution of capacitance of a region outside the depression of the workpiece and in-plane distribution of temperature of the region outside the depression of the workpiece.

5. The apparatus according to claim 1, wherein the member is transported together with the workpiece in a state in which the control section is inserted into the depression and the gap being provided between the control section and the bottom surface of the depression.

6. The apparatus according to claim 1, wherein the member is configured to control in-plane distribution of temperature of a region including the workpiece.

7. The apparatus according to claim 1, wherein the second surface is a flat surface.

8. The apparatus according to claim 1, wherein a thickness of a region provided with the depression of the workpiece is thinner than a thickness of a region not provided with the depression of the workpiece.

9. The apparatus according to claim 1, wherein the workpiece is placed on the member, the control section is inserted into the depression so that a gap is formed between the second surface of the convex portion and a bottom surface of the depression and formed between the side surface of the convex portion and the side surface of the depression, a dimension between the second surface of the convex portion and the bottom surface of the depression and a dimension between the first surface and a surface of the region not provided with the depression of the workpiece is set so that capacitance is equal in the region provided with the depression of the workpiece and in the region not provided with the depression of the workpiece.

* * * * *